(12) United States Patent
Mashimo et al.

(10) Patent No.: US 6,583,805 B2
(45) Date of Patent: *Jun. 24, 2003

(54) EXPOSURE UNIT FOR IMAGE FORMING APPARATUS USING ELECTROPHOTOGRAPHIC SYSTEM, AND ELECTROPHOTOGRAPHIC IMAGE FORMING APPARATUS

(75) Inventors: Seiji Mashimo, Tokyo (JP); Noboru Koumura, Shizuoka-ken (JP); Yukio Nagase, Shizuoka-ken (JP); Akihiro Senoo, Tokyo (JP); Kazunori Ueno, Ebina (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,721

(22) Filed: May 28, 1999

(65) Prior Publication Data

US 2002/0118271 A1 Aug. 29, 2002

(30) Foreign Application Priority Data

Jun. 5, 1998 (JP) ............................................. 10-157000

(51) Int. Cl.[7] ................................................ B41J 27/00
(52) U.S. Cl. ...................................... 347/241; 347/244

(58) Field of Search ................................. 347/130, 134, 347/238, 241, 244; 257/98

(56) References Cited

U.S. PATENT DOCUMENTS

| 4,734,723 A | * | 3/1988 | Ishitobi ....................... 347/134 |
| 5,023,442 A | * | 6/1991 | Taniguchi et al. ...... 347/137 X |
| 5,465,265 A | * | 11/1995 | Ota ........................... 257/98 X |

FOREIGN PATENT DOCUMENTS

| EP | 0 756 334 A2 | * | 7/1996 | ........... H01L/33/00 |
| JP | 8-288064 | * | 11/1996 | ........... H05B/33/10 |
| JP | 9-45477 | | 2/1997 | |

OTHER PUBLICATIONS

Serway, Raymond A., "Physics: For Scientists and Engineers", Saunders College Publishing, pp. 764, 776 and 777, copyright 1982.*

* cited by examiner

Primary Examiner—Hai Pham
(74) Attorney, Agent, or Firm—Fitzpatrick, Cella, Harper & Scinto

(57) ABSTRACT

An exposure unit includes a luminescent device array including a pair of electrodes and an organic compound layer disposed between the electrodes, and a microlens array arranged corresponding to the luminescent device array. The exposure unit is used in an image forming apparatus using an electrophotographic system.

14 Claims, 5 Drawing Sheets

EXPOSURE UNIT FOR IMAGE FORMING APPARATUS USING ELECTROPHOTOGRAPHIC SYSTEM, AND ELECTROPHOTOGRAPHIC IMAGE FORMING APPARATUS

BACKGROUND OF THE INVENTION

1. Field of the Invention

The present invention relates to an exposure unit used in electrophotographic systems, such as copying machines and electrophotographic units, and relates to an electrophotographic image forming apparatus.

2. Description of the Related Art

Usual exposure systems for forming latent images on photosensitive members include laser beam systems and LED array systems. A laser beam system, however, requires optical components, such as polygon mirrors and lenses, and thus have some problems, for example, the difficulty of miniaturizing apparatuses and of operating at high-speed.

On the other hand, an LED array system uses an expensive substrate and requires the arrangement of many cut chips, because the array cannot be formed of one substrate. Such arrangement results in problematic steps and gaps between chips. Furthermore, the LED array system requires a rod lens array for forming an image on a photosensitive member. Since light is collected by the rod lens array with low efficiency, light from a luminescent device cannot be effectively used when diffused light is focused on the photosensitive member using the rod lens array. Thus, a high intensity of light must be emitted from the luminescent device so that the required intensity of light reaches the photosensitive member.

The present assignee disclosed, in Japanese Patent Application Laid Open No. 9-45477 and European Patent No. 0756334A2, a light emitting device including a positive electrode layer, an active layer, and a negative electrode layer in which the distance between the positive electrode layer and the negative electrode layer is partly different at some positions so as to emit mixed light having different wavelengths in response to the distance. In detail, the light emitting device includes a first substrate, a positive electrode layer formed on the first substrate, a second substrate, a negative electrode layer formed on the second substrate, and an active layer formed between the positive electrode layer and the negative electrode layer. Light emitting regions are formed between the positive electrode layer and the negative electrode layer in such a manner that the distance between the positive electrode layer and the negative electrode layer varies from one light-emitting region to another. The device further includes a resin layer disposed either between the first substrate and the positive electrode layer or between the second substrate and the negative electrode layer to form the light-emitting regions in which the distance varies.

In this light emitting device, the luminescent device is an organic luminescent device, and the substrate for forming the luminescent device has a microlens array. This pending patent, however, does not disclose an electrophotographic apparatus of the present invention.

SUMMARY OF THE INVENTION

It is an object of the present invention to provide an exposure unit for electrophotographic apparatuses, which can solve the above-mentioned problems.

It is another object of the present invention to provide an exposure unit for electrophotographic apparatuses, which is capable of high-speed operation, is compact, is formed with low cost, and has high resolution.

It is a further object of the present invention to provide an exposure unit for electrophotographic apparatuses, which can effectively use light emitted from a luminescent device.

It is another object of the present invention to provide an electrophotographic image forming apparatus using the exposure unit.

The exposure unit, for an image forming apparatus using an electrophotographic system in accordance with the present invention, includes a luminescent device array comprising a pair of electrodes and an organic compound layer disposed between the electrodes, and a microlens array arranged corresponding to the luminescent device array.

The electrophotographic image forming apparatus in accordance with the present invention includes an electrophotographic member, a charging unit, an exposure unit, a developing unit, a transfer unit, and a fixing unit, wherein the exposure unit includes a luminescent device array comprising a pair of electrodes and an organic compound layer disposed between the electrodes, and a microlens array arranged corresponding to the luminescent device array.

The exposure unit does not require alignment between the luminescent device array and a lens system. Such an exposure unit is applicable to an optical printer head and an electrophotographic apparatus.

DESCRIPTION OF THE PREFERRED EMBODIMENT

The present invention will now be described in detail with reference to the attached drawings.

Figure 1:
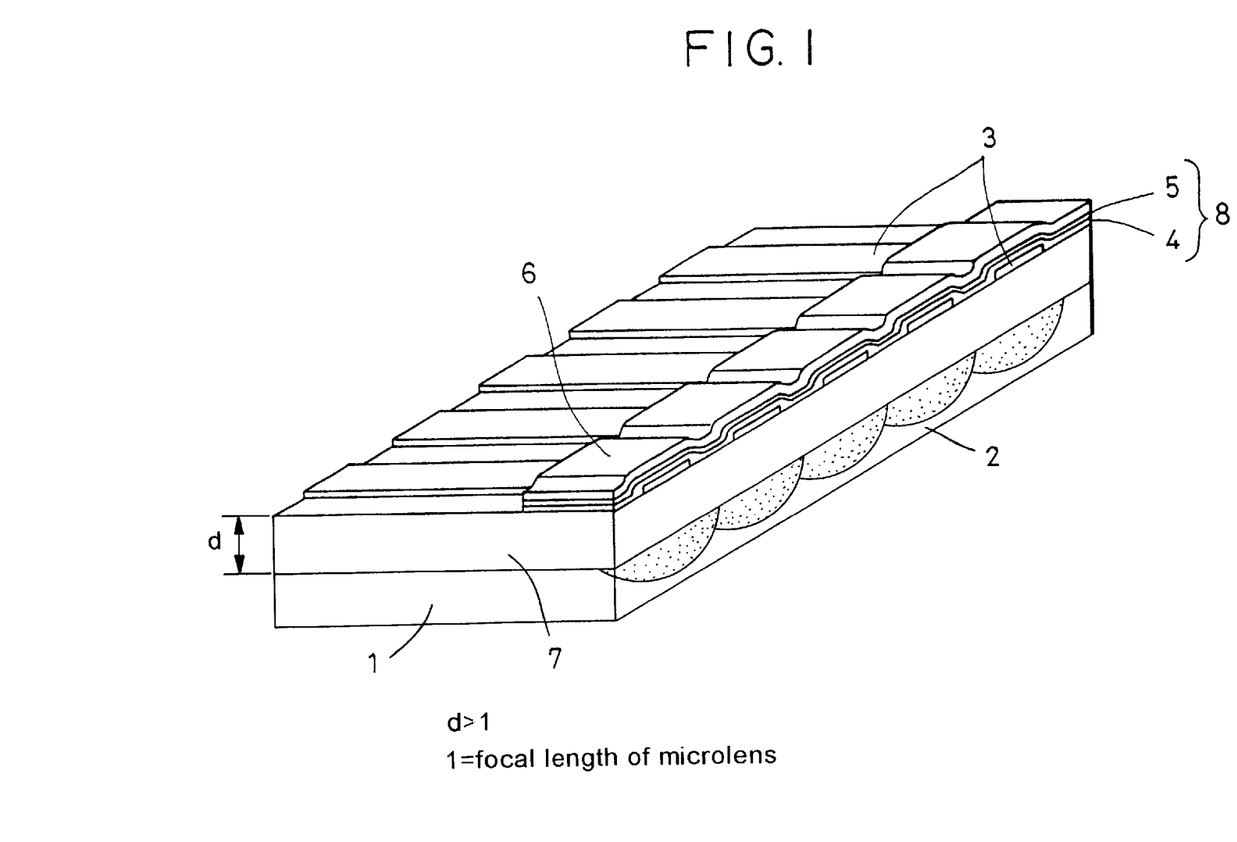
FIG. 1 is an isometric cross-sectional view of a luminescent device array in accordance with the present invention.

FIG. 1 is an isometric cross-sectional view of a luminescent device array used in an exposure unit in accordance with the present invention.

A dielectric layer 7 is formed on a substrate 1. The substrate 1 has a microlens array 2. Positive electrode layers 3 are formed on the substrate 1, and are covered with an organic compound layer 8, which is composed of a hole transport layer 4 and an electron transport layer 5. Negative electrode layers 6 are formed thereon. Intersecting regions of the positive electrode layers 3 and the negative electrode layers 6 function as luminescent sections and emit light when a voltage is applied between the positive electrode layers 3 and the negative electrode layers 6. The size of each luminescent section can be adjusted by the widths of the positive electrode layers 3 and the negative electrode layers 6. Each luminescent section is arranged on the corresponding microlens of the microlens array 2.

It is preferable that the area of the opening of each microlens of the microlens array be larger than the area of the corresponding luminescent section for effective collection of the light from the luminescent section. Furthermore, it is preferable that the focal length of each microlens of the microlens array 2 be shorter than the distance between two adjacent microlenses for achieving a high intensity of light.

The microlens array 2 is not limited to that shown in FIG. 1, as long as the array can effectively collect the light from the luminescent sections. For example, the microlens array 2 may be composed of concave microlenses instead of the convex microlenses shown in FIG. 1. Although the microlens array 2 is disposed on the face on which the organic compound layer 8 is formed in FIG. 1, the microlens array 2 may be disposed on the other face which does not come into contact with the organic compound layer 8.

Any material capable of forming luminescent devices and microlenses can be used for the substrate 1. Preferable materials for the substrate 1 are transparent insulating substrates, such as glass, e.g. soda lime glass, and resin films.

The positive electrode layers 3 are preferably composed of a material having a large work function. Examples of such materials includes ITO, tin oxide, gold, platinum, palladium, selenium, iridium, and copper iodide. In contrast, the negative electrode layers 6 are preferably composed of a material having a small work function. Examples of such materials include magnesium, aluminum, indium, and alloys thereof, such as magnesium-silver alloys.

The organic compound layer 8 may have a single-layered configuration or a multilayered configuration. For example, as shown in FIG. 1, the organic compound layer 8 is composed of the hole transport layer 4 and the electron transport layer 5. Positive holes are injected into the hole transport layer 4 from the positive electrode layers 3, whereas electrons are injected into the electron transport layer 5 from the negative electrode layers 6. Either the hole transport layer 4 or the electron transport layer 5 functions as a luminescent layer. A fluorescent layer containing a fluorescent material may be provided between the hole transport layer 4 and the electron transport layer 5. A single-layered configuration can function as the hole transport layer 4, the electron transport layer 5, and the fluorescent layer.

Preferable organic luminescent materials emit light having a spectrum distribution which is sensitive to the photosensitive member used, such as the photosensitive drum. A material used for the hole transport layer 4 is, for example, N,N'-bis(3-methylphenyl)-N,N'-diphenyl-(1,1'-biphenyl) 4,4'-diamine (hereinafter referred to as TPD). The following materials can also be used for the hole transport layer 4.

Hole Transport Compounds

-continued

A material used for the electron transport layer 5 is, for example, tris(8-quinolinol) aluminum (hereinafter referred to as Alq$_3$). The following materials can also be used for the electron transport layer 5.

Electron Transport Compounds

The following dopant dyes may be doped into the electron transport layer 5 or the hole transport layer 4.

Dopant Dyes

As shown in FIG. 1, the dielectric layer 7 composed of SiO$_2$ or SiO may be provided between the positive electrode layers 3 and the substrate 1 in the present invention. It is preferable that the thickness of the dielectric layer 7 be larger than the focal length of each microlens of the microlens array 2, as shown in FIG. 1, for achieving a high intensity of light. Accordingly, the focal length of the microlens is less than the distance between the microlens and the corresponding luminescent section.

A method for forming the luminescent device array in accordance with the present invention will now be described with reference to the steps shown in FIGS. 2A to 2D.

Figure 2A:
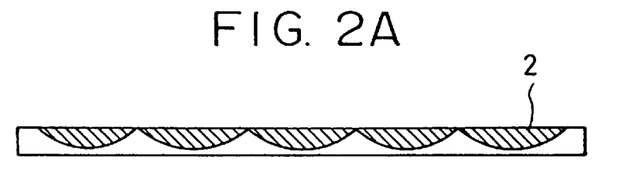
FIGS. 2A to 2D are cross-sectional views of production steps for a luminescent device array in accordance with the present invention.

A) Preparation of Microlens Array (FIG. 2A)

The microlens array 2 is formed by ion exchange of the substrate 1 at the positions corresponding to the luminescent sections.

Both faces of the substrate 1 are thoroughly cleaned. The entire substrate 1 is masked with a titanium film which does not allow permeation of ions. The titanium film is patterned by a photolithographic etching process to form an array of openings. The substrate 1 is immersed into a mixed molten salt of TlNO$_3$ and KNO$_3$, or of a nitrate or sulfate of Ag$^+$ or Tl$^+$ for ion exchange treatment. The microlens array 2 including many hemispherical mirolenses is thereby formed.

The microlens array 2 may be formed stepwise so that each microlens has a gradual distribution of the refractive index. The method for forming the microlens array 2 is not limited to the above description, and may include, for example, a method using a photoresist or a replica method.

Figure 2B:
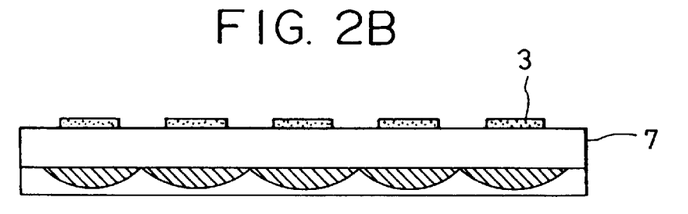

B) With reference to FIG. 2B, the dielectric layer 7 is formed on the microlens array 2 by a sputtering process. Then, the positive electrode layers 3 having a predetermined thickness are formed on the microlens array 2 by a sputtering process through a metal mask so that the positive electrode layers 3 have a predetermined line width and a predetermined pitch.

Figure 2C:
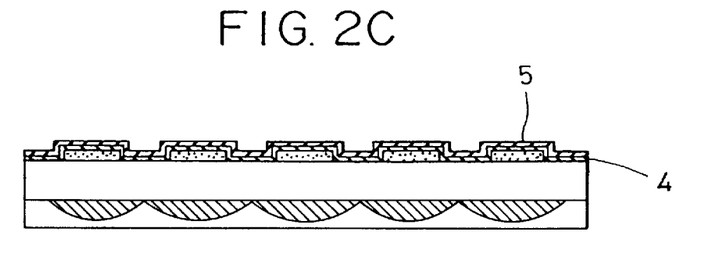

C) With reference to FIG. 2C, the hole transport layer 4 and the electron transport layer 5 are deposited on the entire surface by a vacuum deposition process.

Figure 2D:
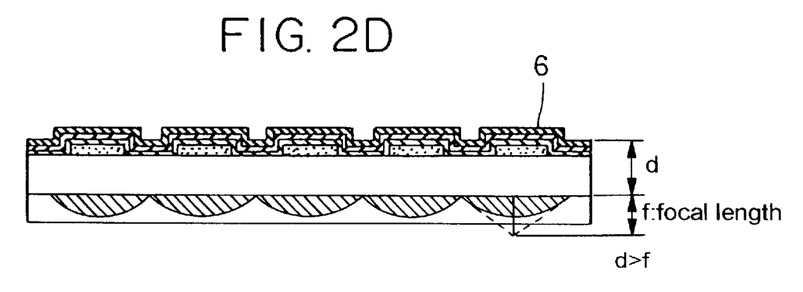

D) With reference to FIG. 2D, the negative electrode layers 6 are formed through a metal mask having a predetermined line width which is disposed so that the negative electrode layers 6 overlap the microlens array 2.

Figure 3:
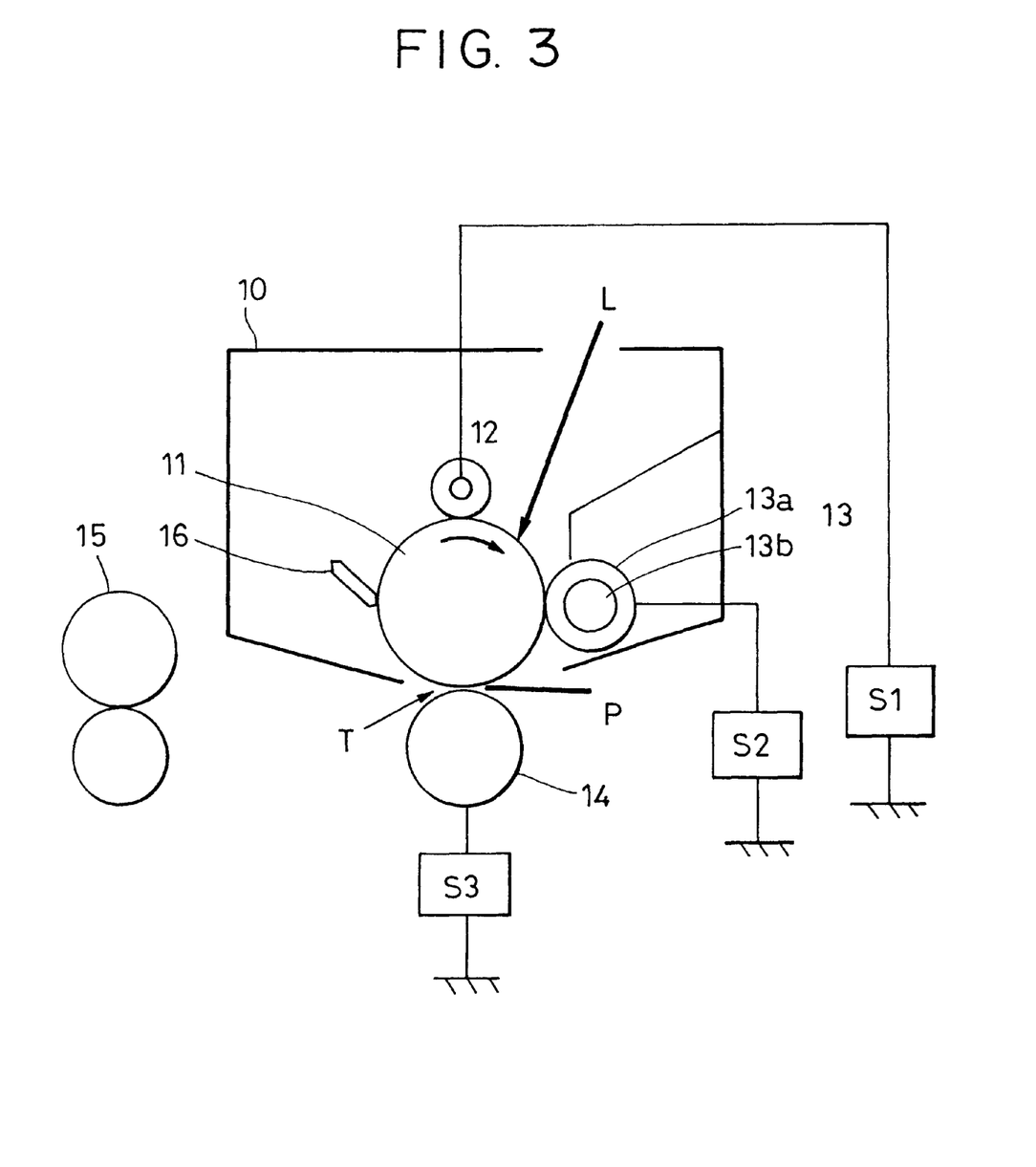
FIG. 3 is a schematic diagram of an electrophotographic image forming apparatus in accordance with the present invention.

FIG. 3 is a schematic diagram of an electrophotographic image forming apparatus in accordance with the present invention. The electrophotographic image forming apparatus includes a rotating-drum-type electrophotographic photosensitive member 11 as an image carrier, a charging unit 12, a developing unit 13, a transfer unit 14, a fixing unit 15, and a cleaning unit 16.

A luminescent device array (not shown in the drawing) is connected to a driver, and is used as a light source L. A DC voltage is applied between the positive electrode layers 3 and the negative electrode layers 6 to emit green light from a luminescent section. The light is focused by the microlenses onto the photosensitive member 11 to form a clear image.

The entire photosensitive member 11 is uniformly charged by the charging unit 12. The charged surface of the photosensitive member 11 is exposed with light beams L which emerge from the luminescent device array in response to time series digital pixel signals of image information, so that an electrostatic latent image corresponding to the image information is formed on the surface of the photosensitive member 11. The latent image is developed by a developing unit 13 using an insulating toner to form a toner image. In synchronism with this, a transfer or recording medium P is supplied from a feeding section (not shown in the drawing) and is introduced into a nip section T between the photosensitive member 11 and a contact transfer means which is put into contact with the photosensitive member 11 with a given contact pressure, while a given transfer biasing voltage is applied to a transfer roller 14.

The transfer medium P with the transferred toner image is detached from the surface of the photosensitive member 11, is introduced into a fixing unit 15, such as a thermal fixer, to fix the toner image, and is discharged from the apparatus. After the transfer of the toner image, the surface of the photosensitive member 11 is cleaned by the cleaning unit 16 for the subsequent copying operation.

EXAMPLES

Example 1

An organic LED array shown in FIG. 1 was prepared according to the procedure shown in FIGS. 2A to 2D.

On the transparent insulating substrate 1 having the microlens array 2 formed by an ion exchange process, the dielectric layer 7, the positive electrode layers 3, the hole transport layer 4, the electron transport layer 5 as the luminescent layer, and the negative electrode layers 6 were deposited.

The microlens array 2 was formed on the substrate 1 as follows. Both surfaces of a soda lime glass substrate as the transparent insulating substrate 1 were thoroughly cleaned. The entire surface of the glass substrate was masked with a Ti film. The Ti film was patterned by a photolithographic etching process to form an array of openings, composed of openings having a diameter of 30 μm and a center-to-center distance of 80 μm. The substrate was immersed into a mixed molten salt composed of $TlNO_3$ and $KNO_3$ to form the microlens array 2 by ion exchange in which each microlens was a hemisphere having a diameter of approximately 70 μm.

The organic LED was formed as follows. The $SiO_2$ dielectric layer 7 was formed on the microlens array 2 by a sputtering process. The thickness of the dielectric layer 7 was controlled to be thicker than the focal length of the microlens so as to achieve a high intensity of light.

A metal mask having a line width of 50 μm and a pitch of 80 μm was placed thereon, and ITO positive electrode layers 3 having a thickness of 100 nm were formed on the positions over the microlenses by a sputtering process.

The TPD hole transport layer 4 and the $Alq_3$ electron transport layer 5, each having a thickness of 50 nm, were deposited by a vacuum deposition process, in that order, at a deposition rate of 0.2 to 0.3 nm/sec in a vacuum of $2\times10^{-6}$ to $3\times10^{-6}$ Torr.

A metal mask having a line width of 40 μm was placed thereon, and a Mg—Ag (10:1) alloy having a thickness of 200 nm was deposited thereon at a deposition rate of 1 nm/sec and at a deposition rate ratio of Mg/Al=10/1 to form the negative electrode layers 6. The negative electrode layers 6 were formed just above the microlens array 2. The opening area of each microlens was controlled to be larger than the area of each luminescent section to effectively collect the luminescent light.

The resulting organic LED array was connected to a driver and was used as a light source for electrophotography. A DC current was applied to the ITO positive electrode layers 3 and the Mg—Ag negative electrode layers 6. Intersecting regions of the positive electrodes and the negative electrodes emitted green light, and the green light was focused onto a photosensitive drum by the microlens array 2. The output image was satisfactory.

Although the organic LED array had a resolution of 300 dpi in Example 1, the resolution can be changed without restriction by varying the width of the electrodes.

Example 2

Figure 4:
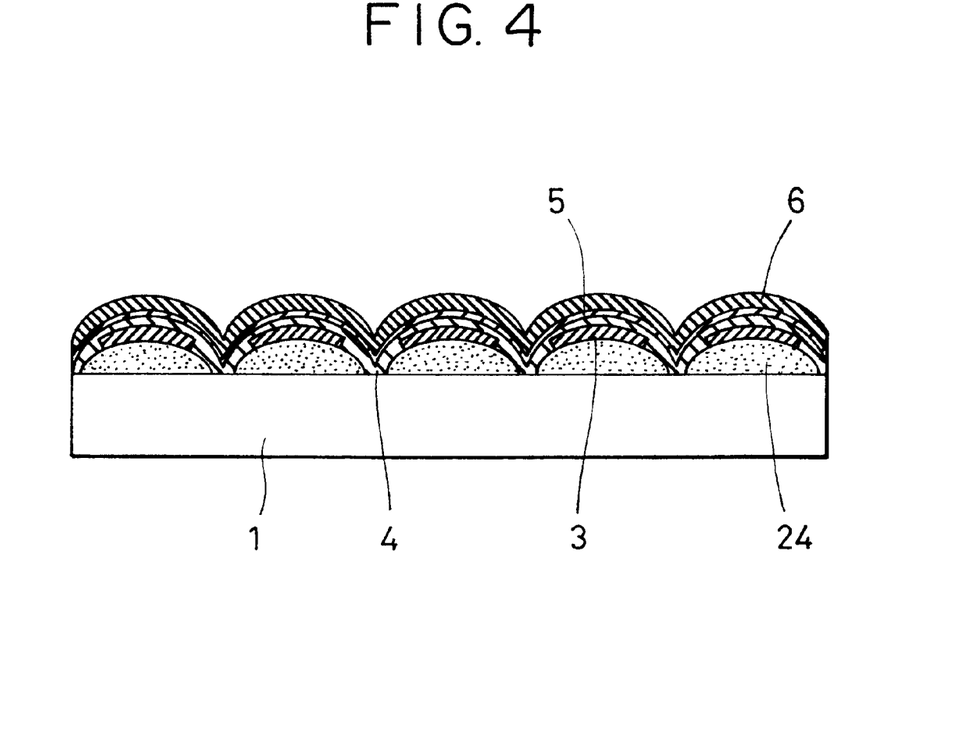
FIG. 4 is a cross-sectional view of an example of a luminescent device array.

FIG. 4 is a cross-sectional view of an example of an organic LED array, in which convex microlenses 24 were formed on a glass substrate as the transparent insulating substrate 1, and the positive electrode layers 3, the hole transport layer 4, the electron transport layer 5 as the luminescent layer, and the negative electrode layers 6 were deposited thereon so that the position of each microlens corresponded to each luminescent section.

The microlenses 24 were formed on the glass substrate as follows. A photoresist for forming the microlenses was applied onto the glass substrate by a coating process, and patterned by a lift-off process or a dry etching process so that the formed pits had a diameter of 70 μm and a center-to center distance of 80 μm. The patterned photoresist was softened and fluidized by annealing to form the convex microlenses 24.

Any photoresist may be used in this invention. Examples of photoresists include UV-curable and far UV-curable photoresists. Among these, preferable photoresists are positive far UV-curable photoresists, e.g. polymethyl methacrylates, PMIPKs, polyglycidyl methylacrylates, and phenol novolak resins, since these photoresists facilitate the formation of condensing lenses.

The ITO positive electrode layers 3 having a thickness of 100 nm were formed on the microlenses 24 through a metal mask having a line width of 50 μm and a pitch of 80 μm by a sputtering process. As in Example 1, the TPD hole transport layer 4 and the $Alq_3$ electron transport layer 5 were deposited by a vacuum deposition process at a deposition rate of 0.2 to 0.3 nm/sec in a vacuum of $2\times10^{-6}$ to $3\times10^{-6}$ Torr.

A metal mask having a line width of 40 μm was placed thereon, and the negative electrode layers 6 which were composed of a Mg—Ag (10:1) alloy and had a thickness of 200 nm were deposited thereon at a deposition rate of 1 nm/sec and at a deposition rate ratio of Mg/Al=10/1. The negative electrode layers 6 were formed just above the array of the microlens 24.

The resulting organic LED array was connected to a driver and was used as a light source for electrophotography. A DC current was applied to the ITO positive electrode layers 3 and the Mg—Ag negative electrode layers 6. Intersecting regions of the positive electrodes and the negative electrodes emitted green light, and the green light was focused onto a photosensitive drum through the microlenses 24. The output image was satisfactory.

Example 3

Figure 5:
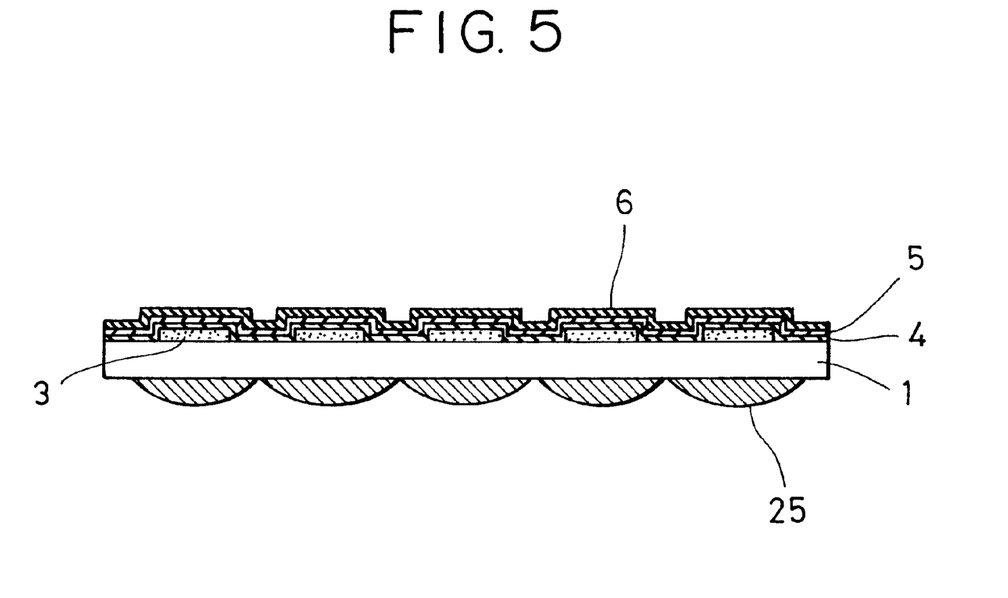
FIG. 5 is a cross-sectional view of another example of a luminescent device array.

An organic LED array shown in FIG. 5 was produced according to the process shown in FIGS. 6A to 6D. In this organic LED array, convex microlenses 25 were formed on the glass substrate 1. The positive electrode layers 3, the hole transport layer 4, the electron transport layer 5 as a luminescent layer, and the negative electrode layers 6 were deposited on the surface of the substrate 1 away from the microlenses 25 so that the position of each microlens corresponded to each luminescent section.

Figure 6A:
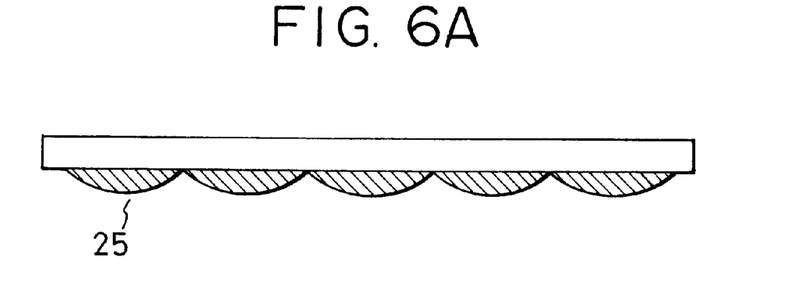
FIGS. 6A to 6D are cross-sectional views of production steps for the luminescent device array in FIG. 5.

With reference to FIG. 6A, an array of the microlenses 25 having a diameter of 75 μm and a center-to-center distance of 80 μm were formed on the glass substrate 1 by a replication process.

Figure 6B:
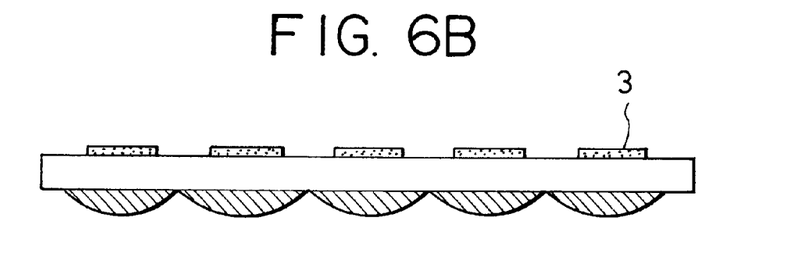

With reference to FIG. 6B, the ITO positive electrode layers 3 having a thickness of 100 nm were deposited on the surface not provided with the microlenses 25 through a metal mask having a line width of 50 μm and a pitch of 80 μm by a sputtering process. Each of the positive electrode layers 3 was formed at the position corresponding to each microlens 25.

Figure 6C:
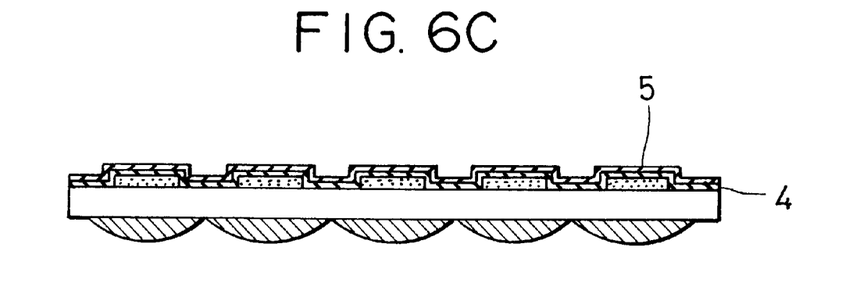

With reference to FIG. 6C, the TPD hole transport layer 4 and the Alq$_3$ electron transport layer 5, each having a thickness of 50 nm, were formed thereon by a vacuum deposition process, as in Example 1.

Figure 6D:
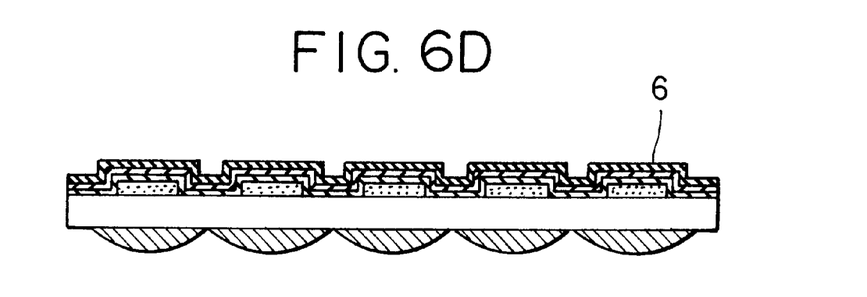

With reference to FIG. 6D, a metal mask having a line width of 40 μm was placed thereon, and a Mg—Ag (10:1) alloy having a thickness of 200 nm was deposited thereon at a deposition rate ratio of Mg/Al=10/1 to form the negative electrode layers 6. The negative electrode layers 6 were formed just above the array of the microlenses 25.

The resulting organic LED array was connected to a driver and was used as a light source for electrophotography. A satisfactory image was output.

As described above, the exposure unit and electrophotographic system in accordance with the present invention are capable of high-speed operation, are compact, are formed with low cost, and have high resolution. Furthermore, the exposure unit and electrophotographic system can effectively use light emitted from a luminescent device.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure unit, for an image forming apparatus using an electrophotographic system, comprising a luminescent device array including plural luminescent sections, each comprising a pair of electrodes and an organic compound layer disposed between the electrodes, and a microlens array formed on a surface of a substrate provided with the organic compound layer, the microlens array including plural microlenses, each microlens being arranged on one side of a corresponding luminescent section, wherein the surface of the substrate provided with the organic compound layer is also provided with a dielectric layer and a focal length of each microlens is smaller than a thickness of the dielectric layer between the microlens and the corresponding luminescent section of the luminescent device array, and wherein the luminescent sections are formed by intersecting regions of the pair of electrodes, formed in a criss-crossing pattern such that the organic compound layer contacts both electrodes and the dielectric layer.

2. An exposure unit according to claim 1, wherein each microlens of the microlens array corresponds to each of luminescent sections of the luminescent device array.

3. An exposure unit according to claim 1, wherein an area of an opening of each microlens is larger than an area of each of the luminescent sections of the luminescent device array.

4. An exposure unit according to claim 1, wherein the microlens array is formed by ion exchange of a substrate at positions corresponding to the luminescent device array.

5. An exposure unit according to claim 1, wherein each microlens is a convex lens with respect to a luminescent section of the luminescent device array.

6. An electrophotographic image forming apparatus comprising an electrophotographic member, a charging unit, an exposure unit, a developing unit, a transfer unit, and a fixing unit, wherein the exposure unit comprises a luminescent device array including plural luminescent sections, each comprising a pair of electrodes and an organic compound layer disposed between the electrodes, and a microlens array formed on a surface of a substrate provided with the organic compound layer, the microlens array including plural microlenses, each microlens being arranged on one side of a corresponding luminescent section, wherein the surface of the substrate provided with the organic compound layer is also provided with a dielectric layer and a focal length of each microlens is smaller than a thickness of the dielectric layer between the microlens and the corresponding luminescent section of the luminescent device array, and wherein the luminescent sections are formed by intersecting regions of the pair of electrodes, formed in a criss-crossing pattern such that the organic compound layer contacts both electrodes and the dielectric layer.

7. An electrophotographic image forming apparatus according to claim 6, wherein each microlens of the microlens array corresponds to each of luminescent sections of the luminescent device array.

8. An electrophotographic image forming apparatus according to claim 6, wherein an area of an opening of each microlens is larger than an area of each of the luminescent sections of the luminescent device array.

9. An electrophotographic image forming apparatus according to claim 6, wherein the microlens array is formed by ion exchange of a substrate at positions corresponding to the luminescent device array.

10. An electrophotographic image forming apparatus according to claim 6, wherein each microlens is a convex lens with respect to a luminescent section of the luminescent device array.

11. An exposure unit, for an image forming apparatus using an electrophotographic system, comprising a luminescent device array including plural luminescent sections, each comprising a pair of electrodes and an organic compound layer disposed between the electrodes, and a microlens array formed on a surface of a substrate which is not provided with the organic compound layer, the microlens array including plural microlenses, each microlens being arranged on one side of a corresponding luminescent section, wherein an area of an opening of each microlens is larger than an area of each of the luminescent sections of the luminescent device array, and the focal length of each microlens is smaller than a thickness of the substrate between each microlens and the corresponding luminescent section, and wherein the luminescent sections are formed by intersecting regions of the pair of electrodes, formed in a criss-crossing pattern such that the organic compound layer contacts both electrodes and the substrate.

12. An electrophotographic image forming apparatus comprising an electrophotographic member, a charging unit, an exposure unit, a developing unit, a transfer unit, and a fixing unit, wherein the exposure unit comprises a luminescent device array including plural luminescent sections, each comprising a pair of electrodes and an organic compound layer disposed between the electrodes, and a microlens array formed on a surface of a substrate which is not provided with the organic compound layer, the microlens array including plural microlenses, each microlens being arranged on one side of a corresponding luminescent section, wherein an area of an opening of each microlens is larger than an area of each of the luminescent sections of the luminescent device array, and the focal length of each microlens is smaller than a thickness of the substrate between each microlens and the corresponding luminescent section, and wherein the luminescent sections are formed by intersecting regions of the pair of electrodes, formed in a criss-crossing pattern such that the organic compound layer contacts both electrodes and the substrate.

13. A luminescent device, comprising a substrate, a pair of electrodes, an organic layer, a dielectric layer, and a microlens, wherein said pair of electrodes is provided on said substrate, said organic layer is provided between said electrodes, said dielectric layer is provided between said substrate and said pair of electrodes, said microlens is provided in said substrate, and a focal length of the microlens, as a length between a principal point of said microlens and a focal point, is smaller than a thickness of said dielectric layer, the focal point being a point on a side of said microlens from which light exits.

14. A luminescent device according to claim 13, wherein electrodes of said pair of electrodes are formed in a criss-crossing pattern such that said organic compound layer contacts both electrodes and said dielectric layer.

* * * * *